(12) United States Patent
Agarwal

(10) Patent No.: US 9,083,232 B1
(45) Date of Patent: Jul. 14, 2015

(54) INPUT OFFSET CONTROL

(71) Applicant: Texas Instruments Incorporated, Dallas, TX (US)

(72) Inventor: Nitin Agarwal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 25 days.

(21) Appl. No.: 14/162,470

(22) Filed: Jan. 23, 2014

(51) Int. Cl.
*H03M 1/66* (2006.01)
*H02M 3/10* (2006.01)
*H03M 1/70* (2006.01)

(52) U.S. Cl.
CPC . *H02M 3/10* (2013.01); *H03M 1/70* (2013.01)

(58) Field of Classification Search
CPC ........... H03M 1/06; H03M 1/12; H03M 1/70; H03M 3/10; G11C 16/06; G11C 17/18; G11B 20/10; G05F 1/00; G05F 1/56; G05F 1/575
USPC ................... 341/118–160; 327/108, 513, 540
See application file for complete search history.

(56) References Cited

U.S. PATENT DOCUMENTS

| | | | | |
|---|---|---|---|---|
| 4,958,139 A * | 9/1990 | Hyatt | ............................. | 341/139 |
| 5,254,957 A * | 10/1993 | Lauffenburger | .............. | 330/308 |
| 6,275,541 B1 * | 8/2001 | Nagahori et al. | ............. | 375/318 |
| 8,022,847 B2 * | 9/2011 | Kaihara et al. | ................ | 341/118 |
| 8,278,893 B2 * | 10/2012 | Motz | ............................. | 323/273 |

* cited by examiner

*Primary Examiner* — Lam T Mai
(74) *Attorney, Agent, or Firm* — John R. Pessetto; Charles A. Brill; Frank D. Cimino

(57) ABSTRACT

Several circuits and methods for input offset control are disclosed. In an embodiment, a input offset control circuit includes a first input circuit and a second input circuit. The first input circuit is configured to operate within first common mode voltage range, configured to provide first input current, and configured to vary the first input current upon or subsequent to a variation of a voltage level in the first common mode voltage range. The second input circuit is coupled to the first input circuit and is configured to operate within second common mode voltage range, configured to provide a second input current, and configured to vary the second input current based on variation of the voltage level in the second common mode voltage range. Upon or subsequent to increasing the common mode voltage, the first input current is reduced and the second input current is increased.

20 Claims, 5 Drawing Sheets and the second input circuit is further configured to reduce and increase the first input current and the second input current, respectively.

In an embodiment, a circuit including a digital to analog converter (DAC) and a comparator is disclosed. The DAC is configured to generate a ramp signal having a slope. The comparator is coupled to the DAC and configured to compare an analog signal with the ramp signal to thereby generate duty cycle information. The comparator is further configured to be associated with an input offset controlled across a common mode voltage range to thereby maintain the slope of the ramp signal. The comparator further includes an input offset control circuit and a gain circuit. The input offset control circuit is configured to receive the analog signal and the ramp signal. The input offset control circuit includes a first input circuit and a second input circuit. The first input circuit is configured to operate within a first common mode voltage range and configured to provide a first input current. The first input circuit is configured to vary the first input current upon a variation of a voltage level within the first common mode voltage range. The second input circuit is coupled to the first input circuit, is configured to operate within a second common mode voltage range, and configured to provide a second input current. The second input circuit is also configured to vary the second input current based on a variation of a voltage level in the second common mode voltage range. Further, upon or subsequent to increasing a common mode voltage applied to both of the first input circuit and the second input circuit, the first input circuit and the second input circuit is further configured to reduce and increase the first input current and the second input current, respectively.

Additionally, in an embodiment, a method of controlling input offset is disclosed. In an embodiment, the method includes selecting a comparator including an input offset control circuit. The input offset control circuit includes a first input circuit and a second input circuit. The first input circuit is configured to operate within a first common mode voltage range and configured to provide a first input current. The second input circuit is configured to operate within a second common mode voltage range and configured to provide a second input current. The method also includes receiving a differential input signal at the input offset control circuit. The method further includes varying the differential input signal based on a variation of a voltage level associated with a common mode voltage. Upon or subsequent to a variation of the voltage level in the first common mode voltage range, the first input circuit is configured to vary the first input current, and upon or subsequent to a variation of the voltage level in the second common mode voltage range, the second input circuit is configured to vary the second input current.

Other aspects and example embodiments are provided in the drawings and the detailed description that follows.

INPUT OFFSET CONTROL

TECHNICAL FIELD

The present disclosure generally relates to the field of input offset control.

BACKGROUND

In accordance to an example scenario, a power converter, such as, for example, a phase shifted full bridge (PSFB) converter, can be used for power conversion in various applications. Examples of the applications can include, but are not limited to, server power supplies, telecom rectifiers, battery charging systems, renewable energy systems, household appliances, industrial textile machines, and compressors. The power converter can be controlled in various modes, such as, for example, a peak current mode control (PCMC). Implementing PCMC in the PSFB converter can involve pulse width modulation (PWM) waveform generation with precise timing control. Such an implementation can be achieved, for example, using a microcontroller integrated with on-chip control peripherals that can include, for example, an analog to digital converter (ADC), analog comparators, a digital to analog converter (DAC), PWM hardware, and programmable slope compensation hardware.

Moreover, one example scenario provides that, in PCMC applications, an analog signal is converted to duty cycle information. Such a conversion is achieved by using an analog comparator that has a finite offset and that compares the analog signal with a ramp signal generated from the DAC. Slope of the ramp signal has to be controlled as the slope affects stability of a control loop of the PCMC applications. The finite offset of the comparator, if constant, does not affect the slope of the ramp signal. A rail-to-rail comparator, however, has a varying offset as a result of a presence of an n-type metal oxide semiconductor (NMOS) input transistor pair and p-type metal oxide semiconductor (PMOS) input transistor pair having different offsets. As a result of the different offsets, an offset changes abruptly at a switch-over point, thereby leading to a slope error in the ramp signal and instability in the control loop of the PCMC applications.

SUMMARY

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

Various circuits and methods for input offset control are disclosed. In an embodiment, an input offset control circuit includes a first input circuit and a second input circuit. The first input circuit is configured to operate within a first common mode voltage range and configured to provide a first input current. The first input circuit is also configured to vary the first input current based on a variation of a voltage level within the first common mode voltage range. The second input circuit is coupled to the first input circuit and is configured to operate within a second common mode voltage range and configured to provide a second input current. The second input circuit is further configured to vary the second input current based on a variation of a voltage level within the second common mode voltage range. Further, upon or subsequent to increasing common mode voltage applied to both of the first input circuit and the second input circuit, the first

The drawings referred to in this description are not to be understood as being drawn to scale except if specifically noted, and such drawings are provided for example purposes only.

DETAILED DESCRIPTION

Current-mode control has been widely used in design of power converters. Different modulation schemes are used in the current mode control, for example, peak current mode control (PCMC). PCMC provides a stable output and is implemented digitally using a digital signal controller (DSC). The DSC is used in a wide range of applications (for example, motor control, power conversion, sensor processing applications, and the like) for reducing power consumption. A microcontroller of the DSC includes on-chip control peripherals. Few of the on-chip control peripherals can include an analog to digital converter (ADC), analog comparators, a digital to analog converter (DAC), pulse width modulation (PWM) hardware, and programmable slope compensation hardware. An example PCMC implementation is explained with reference to FIG. 1.

Figure 1:
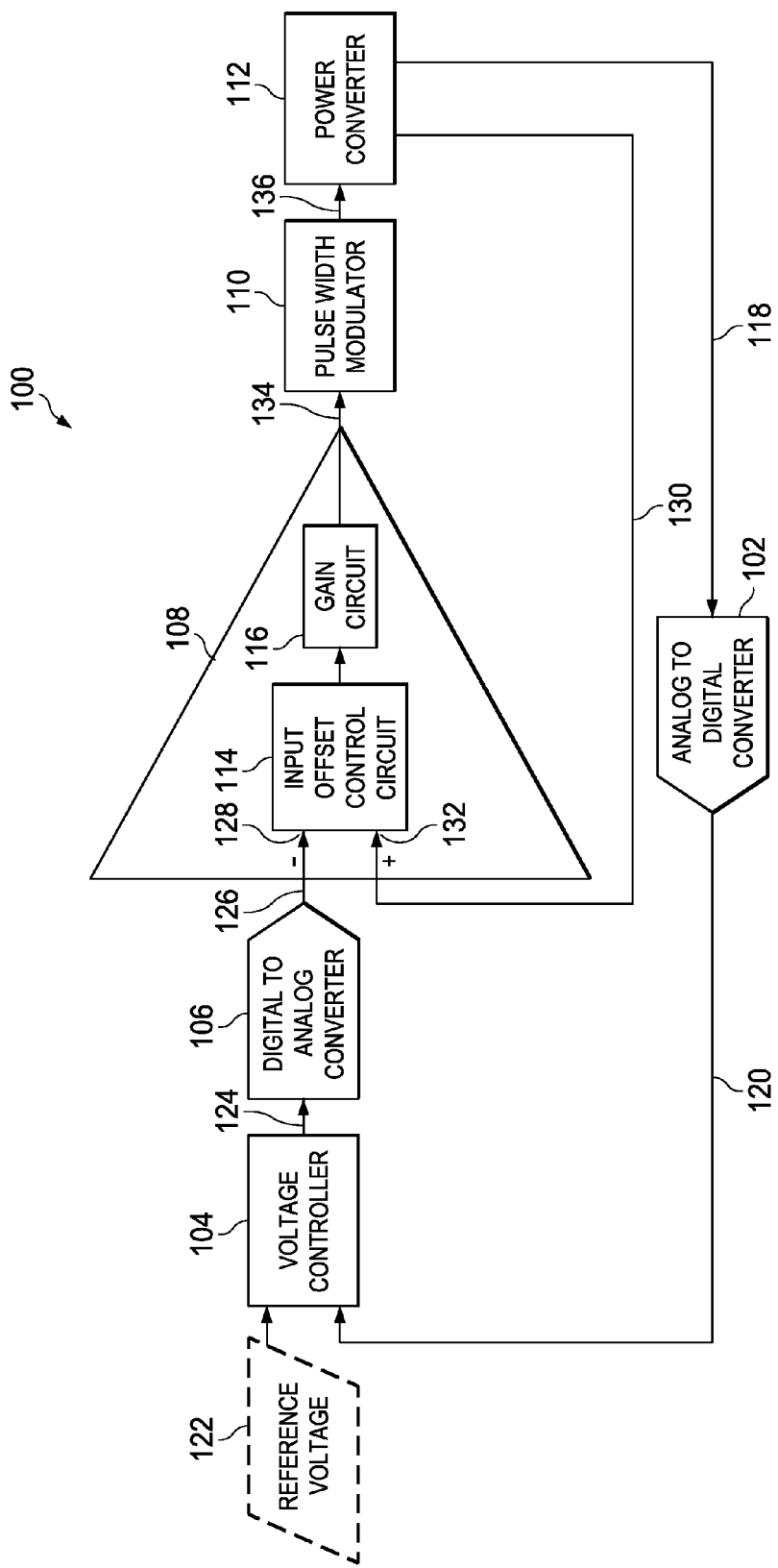
FIG. 1 is a block diagram of an example peak current mode control (PCMC) system in accordance with an example scenario.

FIG. 1 is a block diagram of an example PCMC system 100, in accordance with an example scenario. The PCMC system 100 is implemented by the on-chip peripherals of the microcontroller. The PCMC system 100 can be implemented digitally by using the microcontroller that includes an analog comparator.

In an example embodiment, the PCMC system 100 includes an ADC 102, a voltage controller 104, a DAC 106, a comparator 108, a pulse width modulator 110, and a power converter 112. In one example, the power converter 112 is a duty-controlled buck converter. The comparator 108 includes an input offset control circuit 114 and a gain circuit 116. In some embodiments, the comparator 108 includes only the input offset control circuit 114 and does not include the gain circuit 116.

The ADC 102 receives an output voltage 118 of the power converter 112 that is to be controlled and generates a feedback voltage 120. The voltage controller 104 receives a reference voltage 122 and the feedback voltage 120. The voltage controller 104 is designed based on a frequency response requirement of a control loop of PCMC applications. For the PCMC system 100, an example of the voltage controller 104 is a two-pole two-zero voltage controller. The voltage controller 104 generates an output voltage 124 that is indicative of a peak reference current and is further provided as an input to the DAC 106. In one example, the DAC 106 has a 12-bit input range. The DAC 106 generates a ramp signal 126 (also referred to as a compensation ramp signal) having a slope, corresponding to the output voltage 124 of the voltage controller 104, that is used to damp out sub-harmonic oscillations that is usually observed in the PCMC system 100.

A ramp voltage corresponding to the ramp signal 126 being output from the DAC 106 is applied to an inverting input 128 of the comparator 108. The comparator 108 receives a feedback current signal 130 from the power converter 112. The feedback current signal 130 is converted to an analog signal and a corresponding analog voltage is applied to a non-inverting input 132 of the comparator 108. The comparator 108 compares the analog voltage (applied at the non-inverting input 132 of the comparator 108) with the ramp voltage (applied at the inverting input 128 of the comparator 108) to generate a control signal 134. In some embodiments, the control signal 134 is generated from the gain circuit 116 of the comparator 108. In other embodiments, the control signal 134 is generated from the input offset control circuit 114 of the comparator 108 (in absence of the gain circuit 116). The input offset control circuit 114 and the gain circuit 116 of the comparator 108 are used in operation of the comparator 108 and are explained in detail with reference to FIG. 3.

The control signal 134 drives the pulse width modulator 110 to generate a PWM signal 136 that is used to control the output voltage 118 of the power converter 112. In the operation of the comparator 108, when the analog voltage exceeds the ramp voltage, output of the comparator 108 goes high and disables output of the pulse width modulator 110 in a PWM cycle. On a next cycle, if the output of the comparator 108 is back to zero (i.e. the analog voltage is below the ramp voltage), the output of the pulse width modulator 110 is enabled again.

Accuracy of the comparator 108 is dependent on a plurality of parameters, one of which is negligible input offset. Herein, the term 'input offset' of the comparator 108 can refer to a differential input voltage that causes the comparator 108 to switch from one output logic state to another. Various embodiments of the present technology facilitates in controlling input offset of the comparator 108 across a common mode voltage range. An example embodiment of a block diagram of the comparator 108 is explained with reference to FIG. 3.

An example of the comparator 108 is a rail-to-rail comparator. The rail-to-rail comparator can be defined as a comparator having an output range extending up to a positive supply rail and down to a negative supply rail. On employing the rail-to-rail comparator for controlling the input offset of the comparator 108, the input offset varies due to a presence of an n-type metal oxide semiconductor (NMOS) input transistor pair and p-type metal oxide semiconductor (PMOS) input transistor pair having different offsets. As a result of the different offsets, the input offset changes abruptly at a switch-over point of the comparator 108 thereby leading to a slope error in the ramp signal and instability in the control loop of the PCMC applications. This is explained below with reference to the graphical representations of FIGS. 2A to 2C.

Figure 2A:
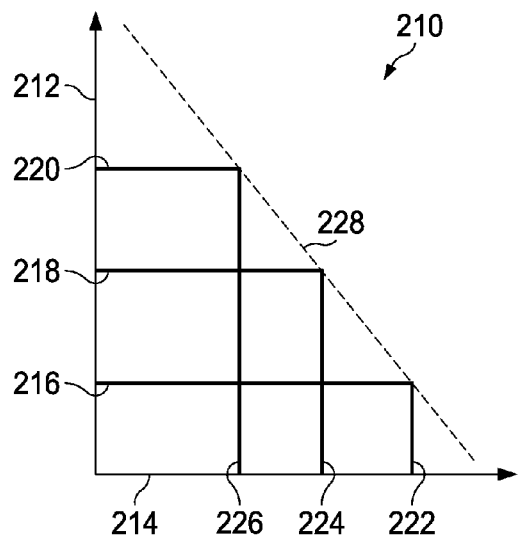
FIGS. 2A-2C are graphical representations illustrating respective duty cycles for multiple comparator input voltages in accordance with an example scenario.
Figure 2B:
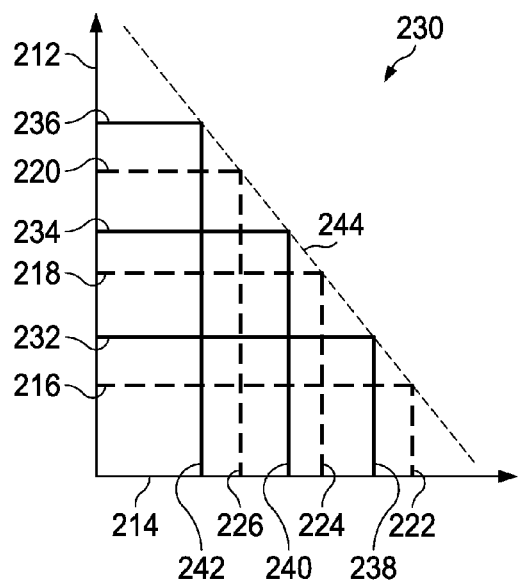
Figure 2C:
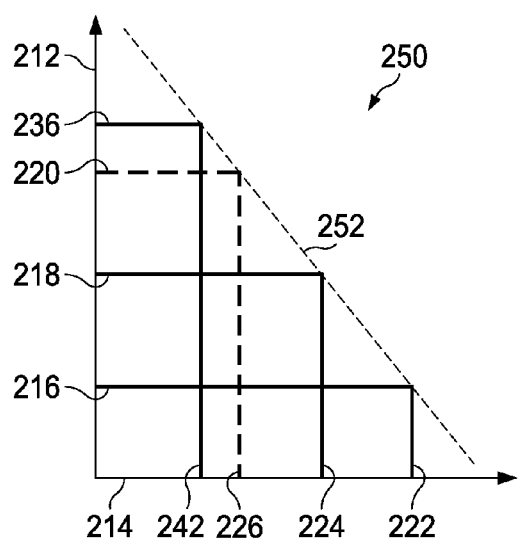

FIGS. 2A to 2C are graphical representations illustrating respective duty cycles for multiple comparator input voltages, in accordance with an example scenario. In PCMC applications, a comparator such as the comparator 108 (in FIG. 1), having a finite offset, is used to convert the analog signal to duty cycle information by comparing the analog signal with the ramp signal of the DAC 106. In case the input offset of the comparator 108 is constant, the slope of the ramp signal remains constant.

Referring to FIG. 2A, a plot 210 between a comparator input voltage (Vc) plotted on y-axis 212 against a duty cycle plotted in x-axis 214 is shown. The plot 210 is depicted corresponding to an example scenario where the comparator 108 is assumed to be an ideal comparator. As shown, three example comparator input voltages indicated by reference numerals 216, 218 and 220 on y-axis 212 have corresponding duty cycles indicated by reference numerals 222, 224, and 226, respectively on x-axis. In an example scenario, the comparator input voltages indicated by the reference numerals 216, 218 and 220 are 1.58 volts (V), 1.62V, and 1.66V, respectively which have respective duty cycles indicated by the reference numerals 222, 224, and 226 on x-axis 214 as 40%, 30%, and 20% respectively. Hence, for an ideal comparator, a change in the duty cycle is constant (for example, at 10%) as a difference in the comparator input voltage is constant (for example, at 40 millivolts (mV)). Output of the DAC 106 for an ideal comparator is represented by a slope 228 of the plot.

Referring to FIG. 2B, a plot 230 between the comparator input voltage (Vc) plotted on y-axis 212 against the duty cycle plotted in x-axis 214 is shown. The plot 230 is depicted corresponding to an example scenario where for an input offset of a finite value, the comparator input voltages indicated by the reference numerals 216, 218, and 220 effectively changes to the comparator input voltages indicated by reference numerals 232, 234, and 236 on y-axis 212. In an example scenario, when input offset is 20 mV, the comparator input voltages represented by reference numerals 216, 218, and 220 (for example, at corresponding voltage values 1.58V, 1.62V, and 1.66V respectively), effectively changes to the comparator input voltages indicated by reference numerals 232, 234, and 236 respectively (at voltage values for example, 1.60V, 1.64V, and 1.68V, respectively) as shown in FIG. 2B. In an example scenario, the duty cycles for the comparator input voltages indicated by the reference numerals 232, 234, and 236 also changes to the duty cycles indicated by the reference numerals of 238, 240, and 242, respectively on x-axis 214. For example, for the comparator input voltages indicated by the reference numerals 232, 234, and 236 (for example, at voltage values 1.60V, 1.64V, and 1.68V, respectively), the example duty cycles indicated by the reference numerals 238, 240, and 242 are 35%, 25%, and 15% respectively. However, as the input offset of the comparator is a finite value, for example 20 mV, and as the difference in comparator input voltage is constant, for example 20 mV, a change in the duty cycle is also constant at a value of 10%. The output of the DAC 106 for the comparator 108 with the input offset at the finite value is represented by a slope 244.

Referring to FIG. 2C, a plot 250 between the comparator input voltage (Vc) plotted on y-axis 212 against the duty cycle plotted on x-axis 214 is shown. The plot 250 is depicted corresponding to an example scenario wherein the input offset of the comparator 108 is adjusted such that for the comparator input voltages above a comparator voltage, the input offset is a finite value and for the comparator input voltages below same comparator voltage, the input offset is zero. Hence, the comparator input voltages indicated by reference numerals 216, 218, and 220 on the y-axis 212 effectively changes to the comparator input voltages indicated by reference numerals 216, 218, and 236, respectively on the y-axis 212 as shown in FIG. 2C. In an example, if the input offset is 20 mV above 1.65V and 0 mV below 1.65V, the comparator input voltages indicated by reference numerals 216, 218, and 220 at 1.58V, 1.62V, and 1.66V, respectively effectively changes to the comparator input voltages indicated by reference numerals 216, 218, and 236 at 1.58V, 1.62V, and 1.68V. The corresponding duty cycles for the comparator input voltages indicated by the reference numerals 216, 218, and 236 also changes to the voltages indicated by reference numerals of 222, 224, and 242, respectively. In an example, the corresponding duty cycles for the comparator input voltages indicated by the reference numerals 216, 218, and 236 at 1.58V, 1.62V, and 1.68V change to the duty cycles indicated by reference numerals of 222, 224, and 242 respectively at 40%, 30%, and 15% respectively. Hence, as illustrated, the change in the duty cycle does not remain constant for a constant difference in the comparator input voltage. For example, the difference in comparator input voltage is constant at 20 mV for the comparator input voltages of 1.58V and 1.62V, and the change in the duty cycle is also constant at 10%. However, the change in the duty cycle is from 10% to 15% when the difference in comparator input voltage is constant at 20 mV for the comparator input voltages of 1.62V and 1.68V. Hence, the output of the DAC 106 is non-linear for the comparator 108 with the input offset changing non-linearly with the comparator input voltages and is represented by a slope 252.

Figure 3:
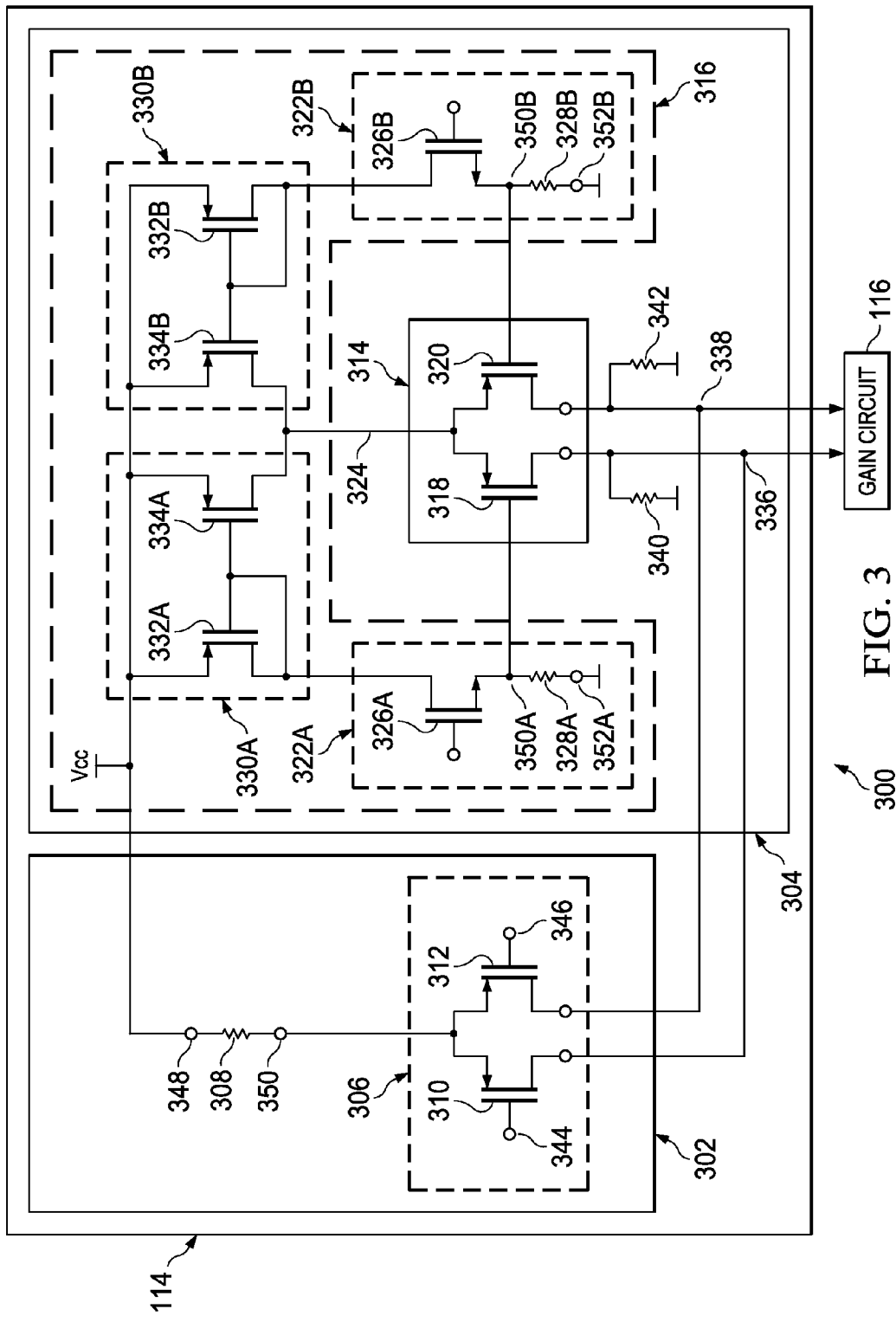
FIG. 3 is a circuit diagram of a comparator in accordance with an embodiment.

FIG. 3 is a circuit diagram of a comparator 300, in accordance with an embodiment. In an embodiment, the comparator 300 illustrated in FIG. 3 is an example of the comparator 108. In an embodiment, the comparator 300 can be used in a plurality of applications to compare two input signals such as two voltages or two currents, and provide an output indicative of relative values of the input signals. Examples of the applications of the comparator 300 can include switching circuits, clock-recovery circuits, window detectors, Schmitt triggers, and level detectors. The comparator 300 can be used in a plurality of electronic devices, for example microcontrollers, computers, mobile phones and other hand-held electronic devices, metering systems, timers, and alarm and monitoring circuits. The comparator 300 can be designed for a fully differential operation, where both inputs of the comparator 300 are differential inputs (Vi+ and Vi−), for use with fully differential analog circuits. The comparator 300 is also designed as the rail-to-rail comparator for use in a rail-to-rail operation where the comparator 300 operates over a wide common mode input voltage range from a negative supply rail to a positive supply rail.

The rail-to-rail comparator (such as the comparator 300) uses two complimentary differential transistor pairs, for example an NMOS input transistor pair which operates at a high end of the common mode voltage range (the positive supply rail), and a PMOS input transistor pair which is configured to operate at a low end of the common mode input voltage range (negative supply rail). Although such a design of the rail-to-rail comparator can facilitate operation over a full range between the positive supply rail and the negative supply rail, there is uncertain performance at a switch-over point of operation. Herein, the term 'switch-over point' can refer to a value of voltage where the rail-to-rail comparator transitions between the NMOS input transistor pair and the PMOS input transistor pair. The uncertain performance of the comparator is due to varying offset in the rail-to-rail comparator since the PMOS input transistor pair and the NMOS input transistor pair are associated with different offsets, which generates slope error in the ramp signal of the DAC 106 at the switch-over point.

In an embodiment, the comparator 300 can facilitate in a smooth transition between the input transistor pairs, thereby mitigating a risk of the uncertain performance of the comparator due to varying offset. In an example embodiment, the comparator 300 can employ an input offset control circuit including a first input circuit and a second input circuit such that the first input circuit and the second circuit are configured to operate within a first common mode voltage range and a second common mode voltage range respectively. In an embodiment, the input offset control circuit is configured to operate in a manner such that based on increasing a common mode voltage, a first input current associated with the first input circuit is reduced, and a second input current associated with the second input circuit is increased, thereby facilitating in a smooth transition from the first input circuit to the second input circuit.

Referring to FIG. 3, the comparator 300 includes the input offset control circuit (for example, the input offset control circuit 114), coupled to the gain circuit (for example, the gain circuit 116). In some embodiments, the comparator 300 includes only the input offset control circuit 114 and does not include the gain circuit 116. Hereinafter, for the ease of understanding and brevity of description, the input offset control circuit 114 can be referred to as the input circuit 114. As discussed, the input circuit 114 includes the first input circuit such as a first input circuit 302 and the second input circuit such as a second input circuit 304.

The first input circuit 302 includes a first differential transistor pair 306 and a first resistive element 308. The first differential transistor pair 306 includes a first transistor 310 and a second transistor 312. In an embodiment, gate terminals of the first transistor 310 and the second transistor 312 are coupled to a positive terminal (for example $V_{i+}$) and a negative terminal (for example $V_{i-}$), respectively. Additionally, source terminals of the first transistor 310 and the second transistor 312 are coupled to a first terminal 350 of the first resistive element 308, respectively. The drain terminals of the first transistor 310 and the second transistor 312 are coupled to an output of the second input circuit 304, as will be explained in later paragraphs. A second terminal 348 of the first resistive element 308 is coupled to a supply voltage source (Vcc).

In an embodiment, the second input circuit 304 is configured to operate within the second common mode voltage range. In an embodiment, the second input circuit 304 includes a second differential transistor pair 314 coupled to a voltage level shifting circuit 316. In an embodiment, the second differential transistor pair 314 includes a third transistor 318 and a fourth transistor 320. The voltage level shifting circuit 316 includes at least one current mirror circuit (for example, a current mirror circuit 330A and/or a current mirror circuit 330B), and at least one first current path (322A and/or 322B) and a second current path 324 configured between the second differential transistor pair 314 and the at least one current mirror circuit. For example, the first current path 322A is configured between the third transistor 318 and the current mirror circuit 330A, and the first current path 322B is configured between the fourth transistor 320 and the current mirror circuit 330B.

In an embodiment, a current path, for example the first current path 322A includes an n-type metal oxide semiconductor (NMOS) transistor 326A coupled to a second resistive element 328A. In an embodiment, a source terminal of the NMOS transistor 326A is coupled to a first terminal 350A of the second resistive element 328A, while a second terminal 352A of the second resistive element 328A is coupled to a ground terminal. In an embodiment, the first current path 322B includes an NMOS transistor 326B coupled to a third resistive element 328B. In an embodiment, a source terminal of the NMOS transistor 326B is coupled to a first terminal 350B of the third resistive element 328B, while a second terminal 352B of the third resistive element 328B is coupled to the ground terminal.

In an embodiment, the NMOS transistor 326A of the first current path 322A and the NMOS transistor 326B of the first current path 322B are coupled to the at least one current mirror circuit such as the current mirror circuit 330A and the current mirror circuit 330B, respectively. In an example embodiment, the current mirror circuit 330A is configured between the first current path 322A and the second current path 324 and includes a PMOS transistor 332A coupled to a PMOS transistor 334A such that a gate terminal of the PMOS transistor 332A is coupled to a gate terminal of the PMOS transistor 334A. Additionally, source terminals of the PMOS transistor 332A and the PMOS transistor 334A are coupled to Vcc. A drain terminal of the PMOS transistor 332A is coupled to a drain terminal of the NMOS transistor 326A, and to the gate terminal of the PMOS transistor 332A. The PMOS transistor 332A hence behaves as a diode transistor. The current mirror circuit 330B is configured between the first current path 322B and the second current path 324 and includes a PMOS transistor 332B coupled to a PMOS transistor 334B such that a gate terminal of the PMOS transistor 332B is coupled to a gate terminal of the PMOS transistor 334B. Additionally, source terminals of the PMOS transistor 332B and the PMOS transistor 334B are coupled to Vcc. A drain terminal of the PMOS transistor 332B is coupled to a drain terminal of the NMOS transistor 326B, and to the gate terminal of the PMOS transistor 332B. The PMOS transistor 332B hence behaves as another diode transistor.

In an embodiment, the drain terminals of each of the third transistor 318 and the fourth transistor 320 are coupled to a resistive element, for example, a third resistive element 340 and a fourth resistive element 342, respectively. In an embodiment, the third resistive element 340 and the fourth resistive element 342 are coupled to the ground terminal at respective opposite terminals thereof. In an embodiment, the drain terminals of the third transistor 318 and the fourth transistor 320 are coupled to the drain terminals of the first transistor 310 and the second transistor 312, respectively. Additionally, the drain terminals of the third transistor 318 and the fourth transistor 320 are branched out of the second input circuit 304 to thereby provide an output of the input circuit 114 through a pair of output terminals such as an output terminal 336 and an output terminal 338 (illustrated in FIG. 3).

In an embodiment, a gate terminal of the third transistor 318 is coupled to a source terminal of the NMOS transistor 326A, and a gate terminal of the fourth transistor 320 is coupled to a source terminal of the NMOS transistor 326B. In an embodiment, source terminals of the third transistor 318 and the fourth transistor 320 are coupled to drain terminals of the PMOS transistor 334A of the current mirror 330A and the PMOS transistor 334B of the current mirror 330B respectively.

In some example embodiments, the first transistor 310, the second transistor 312, the third transistor 318 and the fourth transistor 320 are PMOS transistors. In some example embodiments, the first transistor 310, the second transistor 312, the third transistor 318 and the fourth transistor 320 are NMOS transistors.

In an embodiment, the first current path 322A and the first current path 322B are coupled to Vcc. For example, the gate terminals of the NMOS transistor 326A and the NMOS transistor 326B are coupled to the positive terminal (for example $V_{i+}$) and a negative terminal (for example $V_{i-}$) of Vcc, respectively.

In an embodiment, an output of the input circuit 114 is coupled to the gain circuit 116. For example, the output terminals 336 and 338 of the input circuit 114, for example, are coupled to the gain circuit 116. In an embodiment, the gain circuit 116 is configured to receive the output of the input circuit 114. Herein, for the sake of brevity of description, only one gain circuit is illustrated. However, in various embodiments and/or scenarios, the comparator 300 can include more than one gain circuit. In some embodiments, the comparator 300 includes only the input circuit 114 (and does not include the gain circuit 116) and the output terminals 336 and 338 of the input circuit 114, for example, are coupled to the pulse width modulator 110 to receive the output of the input circuit 114.

In some embodiments, the comparator 300 also includes an output circuit (not shown) in addition to the input circuit 114 and the gain circuit 116. The output circuit is configured to receive a gained up output from the gain circuit 116.

In operation, the input circuit 114 is configured to operate over an entire common mode voltage range. For example, the first input circuit 302 is configured to operate in the first common mode voltage range and the second input circuit 304 is configured to operate in the second common mode voltage range. In an embodiment, the first common mode voltage range includes a first plurality of voltage levels. The first differential transistor pair 306 and the first resistive element 308 are collectively responsive to the voltage supply connected at the gate terminals of the first transistor 310 and the second transistor 312. For example, a positive input voltage (Vi+) (for instance, the analog voltage of the comparator 108 with reference to FIG. 1) is applied at the gate of the first transistor 310 and a negative input voltage (Vi−) (for instance, the ramp voltage of the comparator 108 with reference to FIG. 1) is applied at the gate of the second transistor 312 to provide the first input current being output from the first input circuit 302. The common mode voltage ([(Vi+)+(Vi−)]/2) can be determined as an average of the positive input voltage and the negative input voltage. In some embodiments, the first resistive element 308 provides resistor degeneration. The term 'resistor degeneration' refers to addition of a resistive element (for example, the first resistive element 308) between the source terminals of the first transistor 310 and the second transistor 312, and Vcc. The resistor degeneration is provided in order to linearize voltage to current conversion as is required in the comparator 300 to ascertain change in magnitude of input current is similar in the first input circuit 302 and the second input circuit 304 for similar change in the common mode voltage.

In an embodiment, upon variation of a voltage level within the first common mode voltage range, the first input current being output from the first input circuit 302 varies. For example, if the voltage level increases within the first common mode voltage range, the first input current decreases, thereby causing a decreasing voltage drop across the first resistive element 308.

In an embodiment, on increasing the level of the voltage further such that the voltage lies within the second common mode voltage range, the second input circuit 304 is in operation. The second input circuit 304 is responsive to the positive input voltage (Vi+) at the gate of the NMOS transistor 326A and the negative input voltage (Vi−) at the gate of the NMOS transistor 326B to provide a second input current. In an embodiment, on variation of a voltage level in the second common mode voltage range, the second input circuit 304 varies the second input current. For example, if the voltage level increases in the second common mode voltage range, the second input current also increases.

In some embodiments, voltage levels in the first common mode voltage range and the second common mode voltage range are similar or overlap and are represented as an overlap common mode voltage range.

In an embodiment, on increasing the voltage level in the first common mode voltage range, the first input current in the first input circuit 302 starts reducing and the second input current in the second input circuit 304 starts increasing. If the voltage level in the first common mode voltage range increases to the voltage level in the second common mode voltage range, the first differential transistor pair 306 ceases to operate (for example, switched to an inactive state) and the first input current reduces. Further, in the second common mode voltage range the second input circuit 304 starts operation (for example, is switched to the active state) and the second input current increases.

In some embodiments, if the voltage level in the first common mode voltage range and the voltage level in the second common mode voltage range are present within the overlap range, then there is a gradual reduction in the first input current and increase in the second input current. The NMOS transistor 326A and the second resistive element 328A together constitute a first voltage level shifting circuit (also referred to as an NMOS source follower circuit with resistor degeneration) in the first current path 322A of the voltage level shifting circuit 316. Similarly, the NMOS transistor 326B and the second resistive element 328B together constitute a second voltage level shifting circuit (also referred to as the NMOS source follower circuit with resistor degeneration) in the first current path 322B of the voltage level shifting circuit 316. The first voltage level shifting circuit level shifts the positive input voltage (Vi+) to generate a positive level shifted voltage (Vish+) at the gate of the third transistor 318. A first reference current is further generated in the first current path 322A. The second voltage level shifting circuit level shifts the negative input voltage (Vi−) to generate a negative level shifted voltage (Vish−) at the gate of the fourth transistor 320. A second reference current is further generated in the first current path 322B. The positive level shifted voltage (Vish+) and the negative level shifted voltage (Vish−) are generated by shifting a voltage level of the common mode voltage from the second common mode voltage range to the first common mode voltage range to generate a current. The generated current is supplied to the second differential transistor pair 314. The generated current is applied to the second current path 324 of the voltage level shifting circuit 316.

The current mirror circuit 330A and the current mirror circuit 330B are current sourcing current mirror circuits in which the PMOS transistor 332A and the PMOS transistor 332B (diode transistors) behaves as current regulating transistors and controls the current in associated transistors (for example, by providing a constant current). At one instance, the PMOS transistor 332A regulates the current through the PMOS transistor 334A by mirroring a first current (for example, a diode current) of the PMOS transistor 332A to the PMOS transistor 334A. The first current and the current through the PMOS transistor 334A are substantially identical currents that flow through the first current path 322A and the second current path 324 respectively. Simultaneously, the PMOS transistor 332B regulates the current through the PMOS transistor 334B by mirroring a second current (for example, another diode current) of the PMOS transistor 332B to the PMOS transistor 334B. The second current and the current through the PMOS transistor 334B are substantially identical currents that flow through the first current path 322B and the second current path 324 respectively. Accordingly, the current in the second current path 324 is configured to facilitate the level shifted voltage (Vish+ and Vish−) across the second differential transistor pair 314 by making the current through the second current path 324 a function of the common mode input voltage (for example, Vi+ and Vi−) and independent of the differential input voltage, thereby making the first input current and the second input current a smooth or controlled function of the common mode voltage. In an embodiment, as transconductance (gm) is a function of the current, the transconductance of the first input circuit 302 and the second input circuit 304 is also the smooth or the controlled function of the common mode voltage. In an embodiment, the input offset of the comparator 108/300 (Voffset=[Voffset of_first_input_circuit*ω]+[Voffset of_second_input_circuit*(1−ω)]) in relation to the transconductance can be represented as a weighted average (ω) of a pair of input offset voltages of the first input circuit 302 and the second input circuit 304.

In some embodiments, the third resistive element 340 and the fourth resistive element 342 provide resistor load to the combined first and second input circuits, 302 and 304.

Figure 4A:
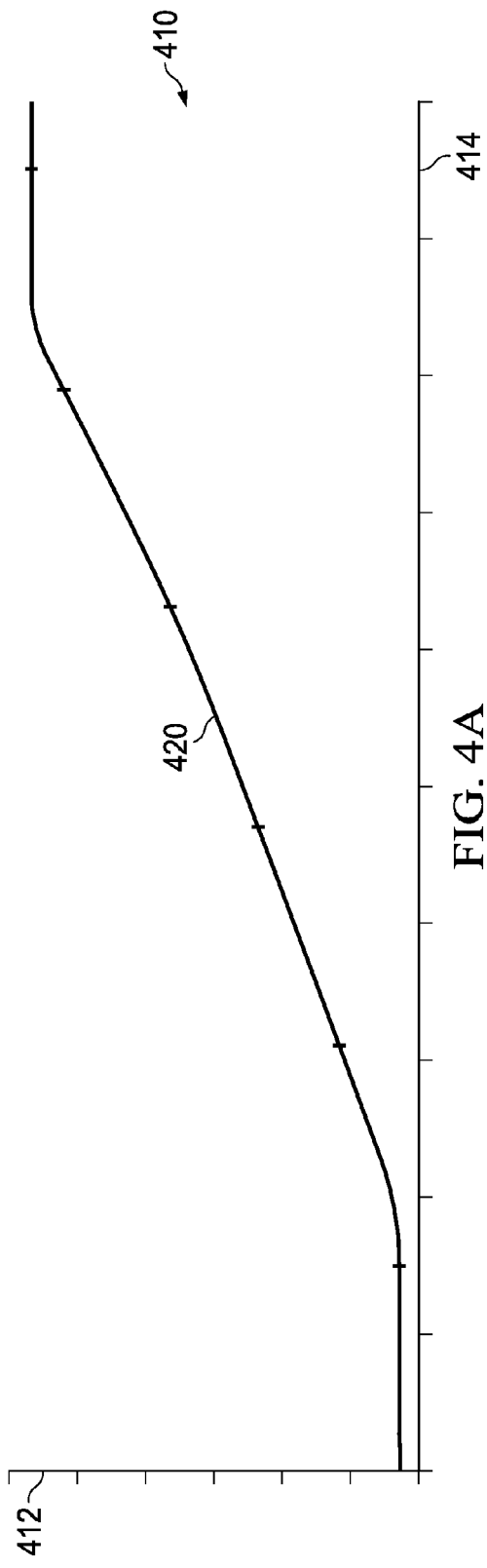
FIG. 4A is a graphical representation illustrating effect of an input offset of a comparator on common mode voltage in accordance with an example embodiment.

FIG. 4A is a graphical representation illustrating effect of an input offset of the comparator 300 on the common mode voltage, in accordance with an example embodiment. In FIG. 4A, a plot 410 between input offset plotted on y-axis 412 against the common mode voltage plotted on x-axis 414 is shown. The plot 410 is depicted corresponding to an example scenario where for an increase in the common mode voltage the input offset gradually increases. In an example scenario, the common mode voltages on x-axis 414 are from 0V to 3.3V and input offsets on y-axis 412 are from −10.0 mV to 10.0 mV. A waveform 420 corresponds to the duty cycle response of the common mode voltage for the input offset. The duty cycle response changes in accordance with changes in the input offset and the common mode voltage. For an increase in the common mode voltage (for example, from 0V to 3.3V), the input offset gradually varies (for example, from −10.0 mV to 10.0 mV). As illustrated in FIG. 4A, the waveform 420 has a smooth variation in the input offset for the rail-to-rail comparator (the comparator 300) as explained with reference to FIG. 3.

Figure 4B:
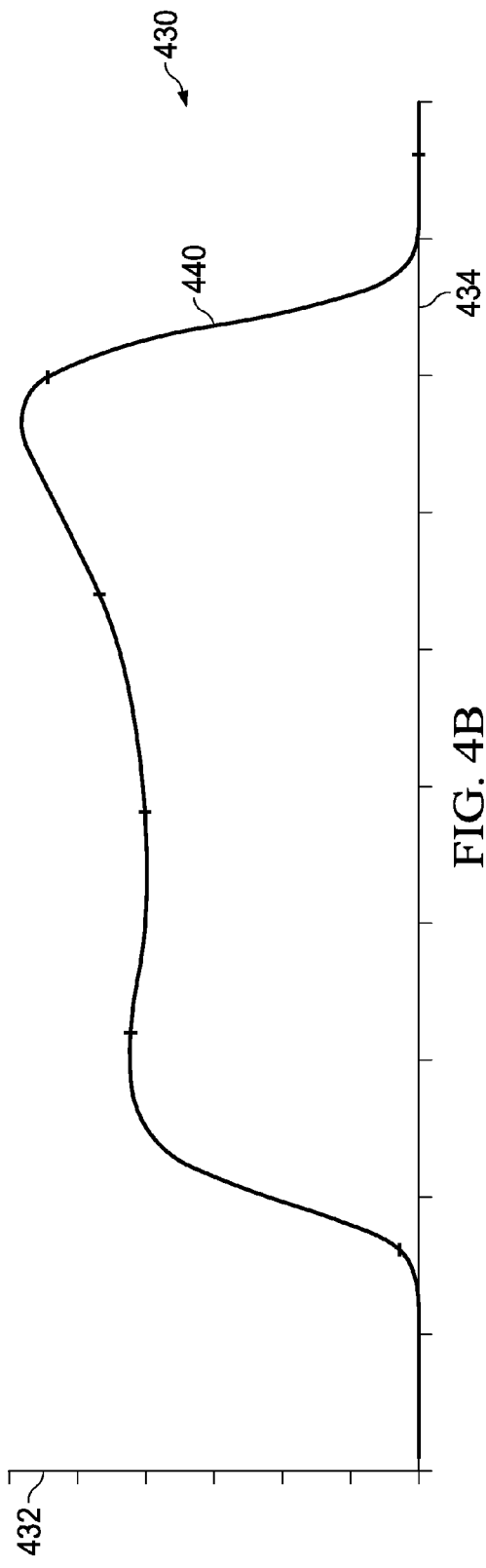
FIG. 4B is a graphical representation illustrating effect of an input offset slope of a comparator on common mode voltage in accordance with an example embodiment.

FIG. 4B is a graphical representation illustrating effect of an input offset slope of the comparator 300 on the common mode voltage, in accordance with an example embodiment. In FIG. 4B, a plot 430 between the input offset slope plotted on y-axis 432 against the common mode voltage plotted on x-axis 434 is shown. The plot 430 is depicted corresponding to an example scenario where for an increase in the common mode voltage the input offset gradually increases thus keeping value of the input offset slope low. In an example scenario, the common mode voltages on x-axis 434 are from 0V to 3.3V and input offset slope on y-axis 432 are from 0% to 0.7%. A waveform 440 is a derivative waveform of the waveform 420 and corresponds to the duty cycle response of the common mode voltage for the input offset slope. The duty cycle response changes in accordance with changes in the input offset and the common mode voltage. For an increase in the common mode voltage (for example, from 0V to 3.3V), the input offset slope gradually varies (for example, from 0% to 0.7%). As illustrated in FIG. 4B, the waveform 440 has a smooth variation in the input offset for the rail-to-rail comparator (the comparator 300) as explained with reference to FIG. 3. As the waveform 420 and the waveform 440 are stable, the input offset of the rail-to-rail comparator (the comparator 300) is controlled across the range of the common mode voltage and a control loop of the PCMC applications is stabilized. Correct duty cycle information for the PCMC applications can also be retrieved based on the rail-to-rail comparator (for example, the comparator 108/300).

Figure 5:
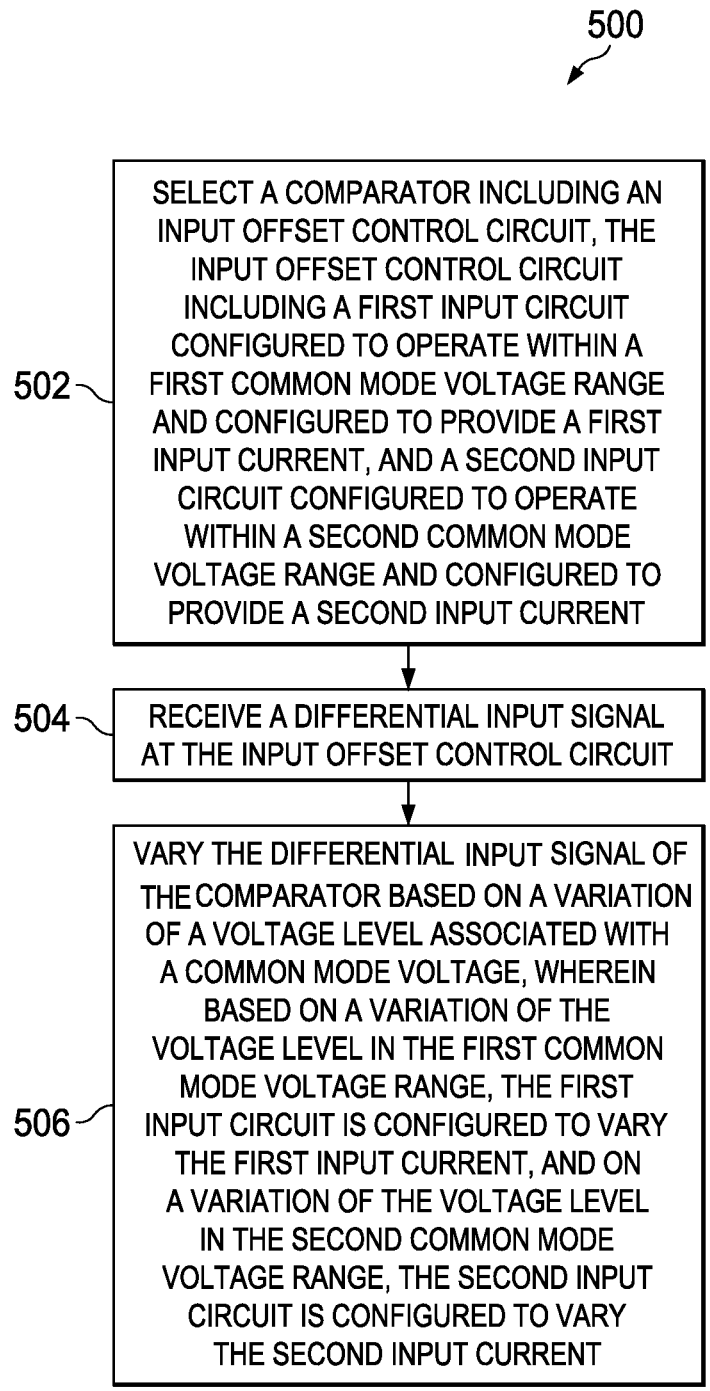
FIG. 5 illustrates a flowchart of an example method of controlling input offset of a comparator across a common mode voltage range in accordance with an example embodiment.

FIG. 5 is a flowchart of an example method 500 for controlling input offset, for example the input offset of a comparator (108 or 300 as explained with reference to FIG. 1 or FIG. 3), across a range of a common mode voltage, in accordance with an example embodiment. In one example embodiment, the comparator can be a rail-to-rail comparator. The comparator is used in a plurality of applications and a plurality of electronic devices. Examples of the applications implementing the comparator can include, on-off control circuits, clock-recovery circuits, window detectors, Schmitt triggers, and level detectors. Examples of the electronic devices can include microcontrollers, computers, mobile phones and other hand-held electronic devices, metering systems, timers, and alarm and monitoring circuits.

At block 502, the comparator including an input offset control circuit (for example, the input offset control circuit 114 of FIG. 3) is selected. The input offset control circuit includes a first input circuit (for example, the first input circuit 302) and a second input circuit (for example, the second input circuit 304). The first input circuit is configured to operate within a first common mode voltage range and provides a first input current. The second input circuit is configured to operate within a second common mode voltage range and provides a second input current. In an embodiment, a voltage level associated with the second input circuit is greater than the voltage level associated with the first input circuit.

At block 504, a differential input signal (for example, Vi+ and Vi− of FIG. 3) is received at the input offset control circuit of the comparator.

At block 506, the differential input signal of the comparator is varied based on a variation of a voltage level associated with a common mode voltage. In some embodiments, upon increasing the voltage level of the common mode voltage from the first common mode voltage range to the second common mode voltage range, the first input current is reduced and the second input current is increased. Such a change in current is almost similar for any value of the common mode voltage.

In some embodiments, a level shifted voltage is generated across the second input circuit in the second common mode voltage range. The second input current is generated by the second input circuit based on the level shifted voltage. The level shifted voltage is a voltage level in the first common mode voltage range.

In some embodiments, the input offset of the comparator includes a weighted average of the input offset voltages of the first input circuit and the second input circuit. As transconductance (gm) is a function of current (the first input current and the second input current), the transconductance of the first input circuit and the second input circuit is a smooth or controlled function of the common mode voltage. The input offset of the comparator (Voffset=[Voffset_of_first_input_circuit*ω]+[Voffset of_second_input_circuit* (1−ω)]) in relation to the transconductance is represented as a weighted average (ω) of a pair of input offset voltages of the first input circuit and the second input circuit.

Without in any way limiting the scope, interpretation, or application of the claims appearing below, advantages of one or more of the example embodiments disclosed herein include controlling input offset of a comparator across a range of a common mode voltage to enable the comparator to operate smoothly (by switching smoothly from a first input differential pair to a second input differential pair of an input offset control circuit of the comparator). The smooth transition facilitates in elimination of slope error in a ramp signal and instability in a control loop of peak current mode control (PCMC) applications caused due to abrupt changes in the input offset at the switch-over point for the comparator, such as a rail-to-rail comparator. The controlling of the input offset of the comparator as disclosed herein precludes a need to increase size of the devices to curb the changes in the input offset. Also, degradation in speed of operation of the comparator is highly reduced. Moreover, as transconductance in the comparator also changes smoothly across the common mode voltage, stability in the comparator is increased. Although the present technology has been described with reference to specific example embodiments, it is noted that various modifications and changes can be made to these embodiments without departing from the broad spirit and scope of the present technology. For example, the various circuits, etc., described herein can be enabled and operated using hardware circuitry (for example, complementary metal oxide semiconductor (CMOS) based logic circuitry), firmware, software and/or any combination of hardware, firmware, and/or software (for example, embodied in a machine-readable medium). For example, the various electrical structures and methods can be embodied using transistors, logic gates, and electrical circuits (for example, application specific integrated circuit (ASIC) circuitry and/or in Digital Signal Processor (DSP) circuitry).

Also, techniques, devices, subsystems and methods described and illustrated in the various embodiments as discrete or separate can be combined or integrated with other systems, modules, techniques, or methods without departing from the scope of the present technology. Other items shown or discussed as directly coupled or communicating with each other can be coupled through some interface or device, such that the items can no longer be considered directly coupled to each other but can still be indirectly coupled and in communication, whether electrically, mechanically, or otherwise, with one another. Other examples of changes, substitutions, and alterations ascertainable by one skilled in the art, upon or subsequent to studying the example embodiments disclosed herein, can be made without departing from the spirit and scope of the present technology.

It should be noted that reference throughout this specification to features, advantages, or similar language does not imply that all of the features and advantages should be or are in any single embodiment. Rather, language referring to the features and advantages can be understood to mean that a specific feature, advantage, or characteristic described in connection with an embodiment can be included in at least one embodiment of the present technology. Thus, discussions of the features and advantages, and similar language, throughout this specification can, but do not necessarily, refer to the same embodiment.

Various embodiments of the present disclosure, as discussed above, can be practiced with steps and/or operations in a different order, and/or with hardware elements in configurations which are different than those which are disclosed. Therefore, although the technology has been described based upon these example embodiments, it is noted that certain modifications, variations, and alternative constructions can be apparent and well within the spirit and scope of the technology. Although various example embodiments of the present technology are described herein in a language specific to structural features and/or methodological acts, the subject matter defined in the appended claims is not necessarily limited to the specific features or acts described above. Rather, the specific features and acts described above are disclosed as example forms of implementing the claims.

What is claimed is:

1. An input offset control circuit comprising:
   a first input circuit configured to operate within a first common mode voltage range and configured to provide a first input current, the first input circuit also configured to vary the first input current based on a variation of a voltage level within the first common mode voltage range; and
   a second input circuit coupled to the first input circuit, the second input circuit configured to operate within a second common mode voltage range and configured to provide a second input current, the second input circuit also configured to vary the second input current based on a variation of a voltage level within the second common mode voltage range, and the first input circuit and the second input circuit being further configured to reduce and increase, respectively, the first input current and the second input current, respectively, in response to an increase in a common mode voltage applied to both of the first input circuit and the second input circuit.

2. The input offset control circuit of claim 1, wherein the first input circuit comprises:
   a first differential transistor pair operative in the first common mode voltage range, the first differential transistor pair comprising:
   a first transistor configured to receive a positive input voltage, and
   a second transistor configured to receive a negative input voltage, a source terminal of the first transistor being coupled to a source terminal of the second transistor, and drain terminals coupled to a pair of output terminals of the second input circuit; and
   a first resistive element having a first terminal coupled to the source terminals of the first transistor and the second transistor, and a second terminal coupled to a supply voltage source.

3. The input offset control circuit of claim 2, wherein the second input circuit comprises:
   a second differential transistor pair operative in the second common mode voltage range; and
   a voltage level shifting circuit interfacing between the first input circuit and the second differential transistor pair and configured to generate a level shifted voltage for the second input circuit, the level shifted voltage being generated by shifting a voltage level of the common mode voltage from the second common mode voltage range to the first common mode voltage range to generate a current, the generated current being supplied to the second differential transistor pair.

4. The input offset control circuit of claim 3, wherein the second differential transistor pair comprises:
   a third transistor configured to receive a positive level shifted voltage; and
   a fourth transistor configured to receive a negative level shifted voltage, a source terminal of the third transistor being coupled to a source terminal of the fourth transistor, and drain terminals coupled to the pair of output terminals of the second input circuit.

5. The input offset control circuit of claim 3, wherein the voltage level shifting circuit comprises:
   at least one first current path and a second current path; and
   at least one current mirror circuit configured between the at least one first current path and the second current path, the at least one current mirror circuit configured to produce substantially identical currents through the at least one first current path and the second current path, wherein current in the second current path facilitates in providing the level shifted voltage across the second differential transistor pair.

6. The input offset control circuit of claim 5, wherein a first current path of the at least one first current path comprises:
   an n-type metal oxide semiconductor (NMOS) transistor having a drain terminal coupled to the at least one current mirror circuit; and
   a second resistive element coupled between a source terminal of the NMOS transistor and a ground terminal.

7. The input offset control circuit of claim 4, wherein the first transistor, the second transistor, the third transistor and the fourth transistor comprises a p-type metal oxide semiconductor (PMOS) transistor.

8. The input offset control circuit of claim 4, further comprising:
   a third resistive element coupled between a drain terminal of the third transistor and a ground terminal; and a fourth resistive element coupled between a drain terminal of the fourth transistor and the ground terminal.

9. A circuit comprising:
a digital to analog converter (DAC) configured to generate a ramp signal having a slope; and
a comparator coupled to the DAC and configured to compare an analog signal with the ramp signal to thereby generate duty cycle information, the comparator further configured to be associated with an input offset controlled across a common mode voltage range so as to maintain the slope of the ramp signal, and the comparator comprising:
  an input offset control circuit configured to receive the analog signal and the ramp signal, the input offset control circuit comprising:
    a first input circuit configured to operate within a first common mode voltage range and configured to provide a first input current, the first input circuit also configured to vary the first input current based on a variation of a voltage level within the first common mode voltage range, and
  a second input circuit coupled to the first input circuit, the second input circuit configured to operate within a second common mode voltage range and configured to provide a second input current, the second input circuit also configured to vary the second input current based on a variation of a voltage level in the second common mode voltage range, and the first input circuit and the second input circuit being further configured to reduce and increase, respectively, the first input current and the second input current, respectively, in response to a common mode voltage applied to both of the first input circuit and the second input circuit being increased, and
  a gain circuit coupled to the input offset control circuit and configured to receive an output voltage of the first input circuit and the second input circuit.

10. The circuit of claim 9, wherein the analog signal is received at a positive input of the comparator and the ramp signal is received at a negative input of the comparator.

11. The circuit of claim 9, wherein the input offset of the comparator comprises a weighted average of input offset voltages of the first input circuit and the second input circuit.

12. The circuit of claim 9, wherein the comparator is a rail-to rail comparator.

13. The circuit of claim 9, wherein the first input circuit comprises:
  a first differential transistor pair operative in the first common mode voltage range, the first differential transistor pair comprising:
    a first transistor configured to receive a positive input voltage, and
    a second transistor configured to receive a negative input voltage, a source terminal of the first transistor being coupled to a source terminal of the second transistor, and drain terminals coupled to a pair of output terminals of the second input circuit; and
  a first resistive element having a first terminal coupled to the source terminals of the first transistor and the second transistor, and a second terminal coupled to a supply voltage source.

14. The circuit of claim 13, wherein the second input circuit comprises:
  a second differential transistor pair operative in the second common mode voltage range; and
  a voltage level shifting circuit interfacing between the first input circuit and the second differential transistor pair and configured to generate a level shifted voltage for the second input circuit, the level shifted voltage being generated by shifting a voltage level of a common mode voltage from the second common mode voltage range to the first common mode voltage range to generate a current, the generated current being supplied to the second differential transistor pair.

15. The circuit of claim 14, wherein the second differential transistor pair comprises:
  a third transistor configured to receive a positive level shifted voltage; and
  a fourth transistor configured to receive a negative level shifted voltage, a source terminal of the third transistor being coupled to a source terminal of the fourth transistor, and drain terminals coupled to the pair of output terminals of the second input circuit.

16. The circuit of claim 14, wherein the voltage level shifting circuit comprises:
  at least one first current path and a second current path; and
  at least one current mirror circuit configured between the at least one first current path and the second current path, the at least one current mirror circuit configured to produce substantially identical currents through the at least one first current path and the second current path, the current in the second current path configured to provide the level shifted voltage across the second differential transistor pair.

17. A method of controlling input offset, the method comprising:
  selecting a comparator comprising an input offset control circuit, the input offset control circuit comprising:
    a first input circuit configured to operate within a first common mode voltage range and configured to provide a first input current, and
    a second input circuit configured to operate within a second common mode voltage range and configured to provide a second input current;
  receiving a differential input signal at the input offset control circuit; and
  varying the differential input signal based on a variation of a voltage level associated with a common mode voltage, wherein, based on a variation of the voltage level in the first common mode voltage range, the first input circuit is configured to vary the first input current, and wherein, based on a variation of the voltage level in the second common mode voltage range, the second input circuit is configured to vary the second input current.

18. The method of claim 17, further comprising increasing the voltage level of the common mode voltage upon reducing the first input current and increasing the second input current.

19. The method of claim 17, further comprising generating a level shifted voltage across the second input circuit in the second common mode voltage range, wherein the second input circuit is configured to generate the second input current based on the level shifted voltage.

20. The method of claim 17, wherein the input offset of the comparator comprises a weighted average of input offset voltages of the first input circuit and the second input circuit.

* * * * *